United States Patent [19]
Kawano

[11] Patent Number: 5,581,117
[45] Date of Patent: Dec. 3, 1996

[54] SI BASE SUBSTRATE COVERED BY A CDTE OR CD-RICH CDZNTE LAYER

[75] Inventor: Masaya Kawano, Tokyo, Japan

[73] Assignee: NEC Corporation, Tokyo, Japan

[21] Appl. No.: 571,414

[22] Filed: Dec. 13, 1995

[30] Foreign Application Priority Data

Dec. 13, 1994 [JP] Japan ................................. 6-332516

[51] Int. Cl.$^6$ ........................ H01L 31/09; H01L 29/161; H01L 27/14; H01L 31/00
[52] U.S. Cl. ................. 257/627; 257/628; 257/188; 257/190; 257/613; 257/614; 257/78; 257/442; 250/370.12
[58] Field of Search .................... 257/627, 11, 10, 257/51, 9, 42, 69, 78, 188, 189, 190, 200, 201, 628, 611, 613, 614, 442, 226; 250/370.12

[56] References Cited

U.S. PATENT DOCUMENTS

| | | | |
|---|---|---|---|
| 4,000,019 | 12/1976 | van den Brekel | 257/628 |
| 4,005,523 | 2/1977 | Milshtein | 257/628 |
| 4,040,079 | 8/1977 | Hara et al. | 257/10 |
| 4,075,654 | 2/1978 | Hara et al. | 257/11 |
| 4,189,826 | 2/1980 | Smith | 257/249 |
| 4,999,694 | 3/1991 | Austin et al. | 257/188 |
| 5,264,699 | 11/1993 | Barton et al. | 257/442 |
| 5,302,232 | 4/1994 | Ebe et al. | 257/188 |
| 5,391,882 | 2/1995 | Rhiger | 257/188 |
| 5,399,503 | 3/1995 | Saito et al. | 437/2 |
| 5,399,901 | 3/1995 | Einthoven | 257/627 |
| 5,420,445 | 5/1995 | Chisholm et al. | 257/614 |
| 5,432,374 | 7/1995 | Norton | 257/442 |
| 5,449,927 | 9/1995 | Hamilton, Jr. et al. | 257/188 |

OTHER PUBLICATIONS

K. Harris et al., "Microstructural defect reduction in HgCdTe grown by photoassisted molecular–beam expitaxy", J. Vac. Sci. Technol. A, Mar./Apr. 1990, vol. 8, No. 2, pp. 1013–1019.

M. Kawano et al., "Twin–formation mechanisms for HgCdTe epilayers", Journal of Crystal Growth, 1992, vol. 117, pp. 171–176.

R. Korenstein et al., "Growth of (111) CdTe on GaAs/Si and Si substrates for HgCdTe epitaxy", J. Vac. Sci. Technol. B, Jul./Aug. 1992, vol. 10, No. 4, pp. 1370–1375.

T. de Lyon et al., "Direct MBE growth of CdZnTe on Si (100) and Si(112) substrates for large–area HgCdTe IRF-PA's", 1993, 11 pages.

Y. Chen et al., "Structure of CdTe(111) B Grown by MBE on Misoriented Si(001)", Journal of Electronic Materials, 1993, vol. 22, No. 8, pp. 951–957.

T. de Lyon et al., "Direct molecular–beam epitaxial growth of ZnTe(100) and CdZnTe(100)/ZnTe(100) on Si(100) substrates", Appl. Phys. Lett., Au. 1993, vol. 63, No. 6, pp. 818–820.

Primary Examiner—Robert P. Limanek
Assistant Examiner—Alexander Oscar Williams
Attorney, Agent, or Firm—Young & Thompson

[57] ABSTRACT

The present invention provides an Si base semiconductor monocrystal substrate which includes an Si(11n) substrate where n=1.5–2.5. An intermediate layer is formed on the Si(11n) substrate. The intermediate layer is made of a material selected from the group consisting of ZnTe and Zn-rich CdZnTe, The intermediate layer has a thickness in the range of 50–200 angstroms. The intermediate layer is oriented in a (11n')B plane. An upper layer is formed on the intermediate layer. The upper layer is made of a material selected from the group consisting of CdTe and Cd-rich CdZnTe. The upper layer is oriented in a (11n")B plane. The indexes n' and n" satisfy the following equations.

$$n' = \frac{n^2 + 2 + (y+1)(n-1)\sqrt{(n+2)^2 - 2y(y+2)(n-1)^2}}{2n + 1 - y(y+2)(n-1)^2}$$

where y is the lattice mismatch between the Si substrate and the intermediate layer.

$$n'' = \frac{n^2 + 2 + (y'+1)(n-1)\sqrt{(n+2)^2 - 2y'(y'+2)(n-1)^2}}{2n + 1 - y'(y'+2)(n-1)^2}$$

where y' is the lattice mismatch between the Si substrate and the upper layer.

12 Claims, 5 Drawing Sheets

SI BASE SUBSTRATE COVERED BY A CDTE OR CD-RICH CDZNTE LAYER

BACKGROUND OF THE INVENTION

The present invention relates to an Si base substrate covered by either a CdTe layer or a Cd-rich CdZnTe layer and a method for forming the same.

In the prior art, a CdZnTe substrate has been used for growth of HgCdTe substrate thereon. Notwithstanding, an Si base substrate covered by either a CdTe layer or a Cd-rich CdZnTe layer is useful as a substrate for growth of HgCdTe crystal thereon or for an infrared device due to its low cost, large area and high solidity. The latter substrate will hereinafter be referred as an Si base substrate.

The Si base substrate may be formed by initially forming a buffer layer on a silicon substrate and subsequent growth of a CdTe or CdZnTe thin film thereon. In view of increase of the productivity, reduction of the cost, and high quality due to reduced impurities, it is advantageous to directly form a CdTe or CdZnTe thin film on the Si substrate.

One of the conventional techniques of direct growth of the CdTe layer on the Si substrate is disclosed in Journal of Electronic Materials Vol. 22, 1993, pp. 951–957. It is disclosed to grow CdTe(111)B on Misoriented Si(001) by molecular beam epitaxy. As illustrated in FIG. 1, a single domain CdTe(111)B just or off has been grown on an Si(001) substrate 18 just or off. The full width at half maximum (FWHM) of x-ray double crystal rocking curves (DCRC) measured is 140 arc-s, which represents the quality of crystallization.

A second conventional technique of direct growth of the CdTe layer on the Si substrate is disclosed in Journal of Vacuum Science and Technologies B10(4), 1992, pp. 1370–1375. It is disclosed to grow a (111) CdTe layer on an Si substrate by hot wall epitaxy. The full width at half maximum (FWHM) of x-ray double crystal rocking curves (DCRC) measured is 315 arc-s at a thickness of 6.1 micrometers.

A third conventional technique is a direct molecular beam epitaxy growth of ZnTe(100) and CdZnTe(100)ZnTe(100) on Si(100) substrate which is disclosed in Applied Physics Letters, 63(6) Aug. 1993, pp. 818–820. Structures are illustrated in FIG. 2A, 2B and 2C. As illustrated in FIG. 2A, an intermediate ZnTe(100) layer 20 is a buffer layer with a thickness of 1 micrometer. A (001) CdZnTe layer 21 with a thickness of 11.5 micrometers is formed on the buffer layer 20. The buffer layer 20 is formed on an Si(001)just or off substrate 18. The molecular beam epitaxy is carried out using CdTe, ZnTe, Cd, and Zn. The (001) CdZnTe layer 21 is measured in the full width at half maximum (FWHM) of x-ray double crystal rocking curves (DCRC) at 158 arc-s. Further, as illustrated in FIG. 2B, an intermediate ZnTe(100) layer 20 is a buffer layer with a thickness of 1 micrometer. A CdTe(112)off layer 19 with a thickness of 9.5 micrometers' is formed on the buffer layer 20. The buffer layer 20 is formed on an Si(112)off substrate 18. The CdTe(112)off layer 19 is measured in the full width at half maximum (FWHM) of x-ray double crystal rocking curves (DCRC) at 670 arc-s. Furthermore, as illustrated in FIG. 2C, an intermediate ZnTe(100) layer 20 is a buffer layer with a thickness of 1 micrometer. A CdTe(552)off layer 19 with a thickness of 9.5 micrometers is formed on the buffer layer 20. The buffer layer 20 is formed on an Si(112)off substrate 18. The CdTe(552)off layer 19 is measured in the full width at half maximum (FWHM) of x-ray double crystal rocking curves (DCRC) at 110 arc-s.

As described above, the CdTe substrate or the CdZnTe substrate has often been used for growth of the HgCdTe crystal layer thereon, where HgCdTe crystal is a material for infrared-ray detectors. In order to obtain the HgCdTe monocrystal growth, it is extremely important not only to strictly optimize growth conditions but also optimize substrate orientations. If the HgCdTe growth is carried out by molecular beam epitaxy, the (112)B plane is the optimum orientation. This is disclosed in Journal of Crystal Growth 117 (1992) 171–176.

On the other hand, it is difficult to obtain twin-free HgCdTe crystal growth by molecular beam epitaxy overlying an Si(001) substrate. It will be necessary for obtaining the mono-crystal in this orientation that a substrate temperature is precisely maintained within a small variation of $\pm 1°°C$. and Hg flux is also precisely maintained within a small variation of $\pm 2\%$. This is disclosed in Journal of Vacuum Science and Technologies 1990, Vol. A8 pp. 1013–1019. However, it is in fact difficult to keep satisfying these conditions during the HgCdTe epi-growth.

If the HgCdTe growth is carried out on a CdZnTe(001) layer overlying a ZnTe layer which overlies the Si(001) substrate, it is difficult to suppress twin-related hillock formations.

If the CdTe layer is grown on a ZnTe buffer layer overlying an Si(112) off substrate, the CdTe layer grown has double domains with different orientations. Particularly when a CdTe(112) off layer is grown, twin crystal is partially formed. Further, it is difficult to obtain the required put ZnTe growth.

In the foregoing circumstances, there has been no Si base substrate free from the above disadvantages.

SUMMARY OF THE INVENTION

Accordingly, it is an object of the present invention to provide an Si base semiconductor monocrystal substrate free from the above-described disadvantages.

It is a further object of the present invention to provide an Si base semiconductor monocrystal substrate having a suitable orientation for remarkably suppressing twin-formations in a CdTe or Cd-rich CdZnTe semiconductor layer grown on the substrate.

It is still a further object of the present invention to provide an Si base semiconductor monocrystal substrate having a suitable orientation for remarkably suppressing crystal defects in a CdTe or Cd-rich CdZnTe semiconductor layer grown on the substrate.

It is yet a further object of the present invention to provide an Si base semiconductor monocrystal substrate having a suitable orientation for providing an energy stability to a CdTe or Cd-rich CdZnTe semiconductor layer grown on the substrate.

It is a furthermore object of the present invention to provide an Si base semiconductor monocrystal substrate having a suitable orientation for providing a crystal perfection to a CdTe or Cd-rich CdZnTe semiconductor layer grown on the substrate.

It is another object of the present invention to provide a method for forming an Si base semiconductor monocrystal substrate free from the above-described disadvantages.

it is still another object of the present invention to provide a method for forming an Si base semiconductor monocrystal substrate having a suitable orientation for remarkably suppressing twin-formations in a CdTe or Cd-rich CdZnTe semiconductor layer grown on the substrate.

It is yet another object of the present invention to provide a method for forming an Si base semiconductor monocrystal substrate having a suitable orientation for remarkably suppressing crystal defects in a CdTe or Cd-rich CdZnTe semiconductor layer grown on the substrate.

It is further another object of the present invention to provide a method for forming an Si base semiconductor monocrystal substrate having a suitable orientation for providing an energy stability to a CdTe or Cd-rich CdZnTe semiconductor layer grown on the substrate.

It is still more object of the present invention to provide a method for forming an Si base semiconductor monocrystal substrate having a suitable orientation for providing a crystal perfection to a CdTe or Cd-rich CdZnTe semiconductor layer grown on the substrate.

It is an additional object of the present invention to provide a method for forming an Si base semiconductor monocrystal substrate suitable for facilitating precise reproduction.

It is still an additional object of the present invention to provide a method for forming an Si base semiconductor monocrystal substrate by using highly pure and manageable materials for molecular beam epitaxy.

It is still an additional object of the present invention to provide a method for forming an Si base semiconductor monocrystal substrate without using any high temperature heat treatment.

The above and other objects, features and advantages of the present invention will be apparent from the following descriptions.

The present invention provides an Si base semiconductor monocrystal substrate which includes an Si(11n) substrate where n=1.5–2.5. An intermediate layer is formed on the Si(11n) substrate. The intermediate layer is made of a material selected from the group consisting of ZnTe and Zn-rich CdZnTe. The intermediate layer has a thickness in the range of 50–200 angstroms. The intermediate layer is oriented in a (11n')B plane. An upper layer is formed on the intermediate layer. The upper layer is made of a material selected from the group consisting of CdTe and Cd-rich CdZnTe. The upper layer is oriented in a (11n")B plane. The indexes n' and n" satisfy the following equations.

$$n' = \frac{n^2 + 2 + (y+1)(n-1)\sqrt{(n+2)^2 - 2y(y+2)(n-1)^2}}{2n + 1 - y(y+2)(n-1)^2}$$

where y is the lattice mismatch between the Si substrate and the intermediate layer.

$$n'' = \frac{n^2 + 2 + (y'+1)(n-1)\sqrt{(n+2)^2 - 2y'(y'+2)(n-1)^2}}{2n + 1 - y'(y'+2)(n-1)^2}$$

where y' is the lattice mismatch between the Si substrate and the upper layer.

There may optionally be provided on the upper layer a top layer made of at least one selected form the group consisting of Hg, Cd, Zn, and Mn in combination with at least one selected from the group consisting of Te, Se and S.

Further, there may optionally be provided on the upper layer laminations of layers made of at least one selected form the group consisting of Hg, Cd, Zn and Mn in combination with at least one selected from the group consisting of Te, Se and S, provided that the layers have the same combination of the elements and the layers are different in composition of the selected elements.

Furthermore, there may optionally be provided on the upper layer laminations of layers made of at least one selected form the group consisting of Hg, Cd, Zn and Mn in combination with at least one selected from the group consisting of Te, Se and S, provided that the layers have different combinations of the elements.

The present invention also provides a method for forming an Si base semiconductor monocrystal substrate by a molecular beam epitaxy wherein at least one of Cd, Te and Zn is irradiated onto an Si(11n) substrate where n=1.5–2.5. In the method, an intermediate layer being made of Zn-rich CdZnTe and having a thickness in the range of 50–200 angstroms is grown on the Si(11n) substrate at a substrate temperature of not more than 300° C. An upper layer being made of a material selected from the group consisting of CdTe and Cd-rich CdZnTe and having a thickness in the range of 400–1000 angstroms is grown on the intermediate layer at a substrate temperature, of not more than 300° C. The substrate is subjected to an in-situ annealing at a temperature in the range of 320°–420° C.

Following to the annealing process, a top layer made of a material selected from the group consisting of CdTe and CdZnTe is grown on the upper layer at a substrate temperature in the range of 200°–350° C.

Alternatively, following to the annealing process, at least one selected from the group consisting of Hg, Cd, Zn and Mn in combination with at least one selected from the group consisting of Te, Se and S are irradiated on the upper layer. As modifications, the irradiations may be carried out with changing the combinations of the selected elements. Alternatively, the irradiations may be carried out with changing doses of the irradiated elements.

BRIEF DESCRIPTIONS OF THE DRAWINGS

Preferred embodiments of the present invention will be described in detail with reference to the accompanying drawings.

FIG.. 8 is a cross sectional elevation view illustrative of a novel Si base substrate in a second embodiment according to the present invention.

Figure 9:
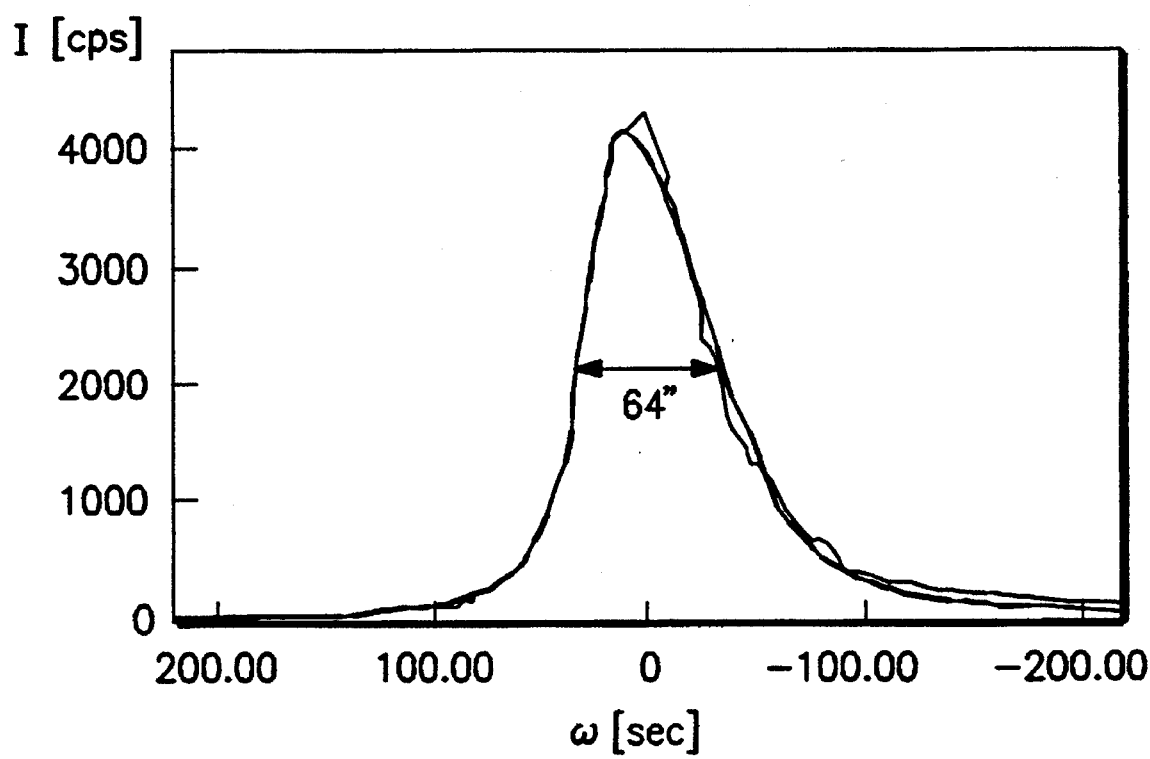

FIG. 9 is a diagram illustrative of X-ray diffraction rocking curve of a novel Si base substrate in a second embodiment according to the present invention.

Figure 10:
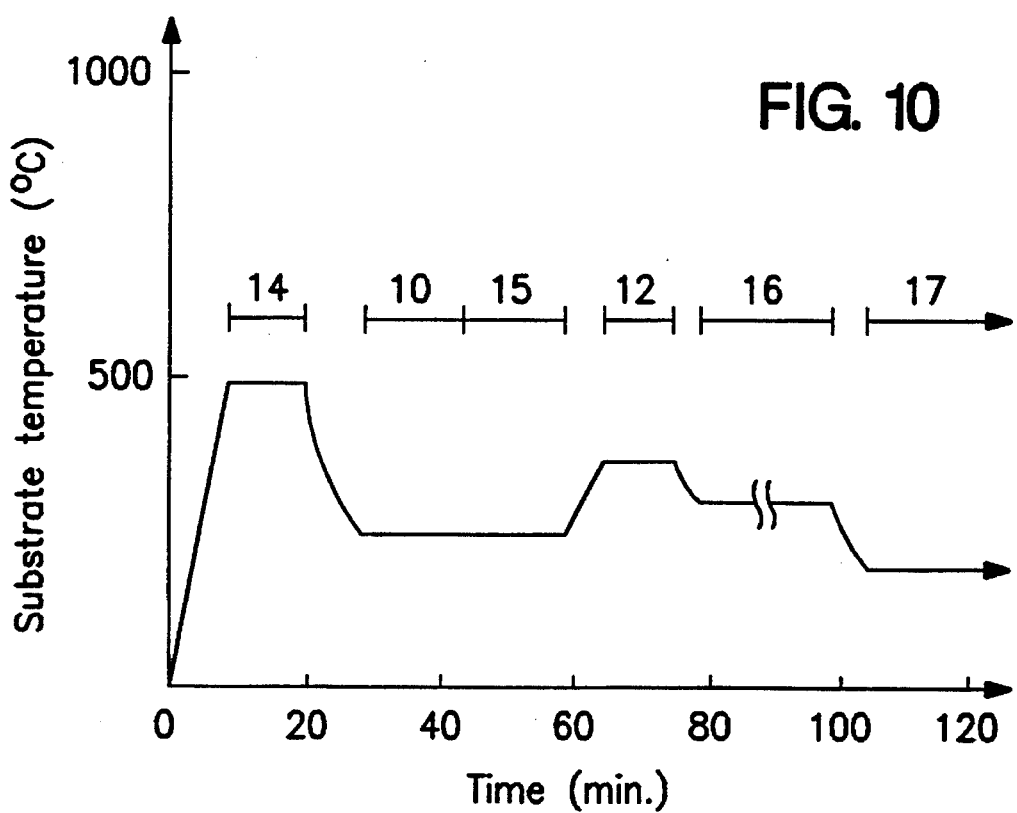

FIG. 10 is a diagram illustrative of a novel method for forming an Si base substrate in a second embodiment according to the present invention.

DISCLOSURE OF THE INVENTION

The present invention provides an Si base semiconductor monocrystal substrate which includes an Si(11) substrate where n=1.5–2.5. An intermediate layer is formed on the Si (11n) substrate. The intermediate layer is made of a material selected from the group consisting of ZnTe and Zn-rich CdZnTe. The intermediate layer has a thickness in the range of 50–200 angstroms. The intermediate layer is oriented in a (11n')B plane. An upper layer is formed on the intermediate layer. The upper layer is made of a material selected from the group consisting of CdTe and Cd-rich CdZnTe. The upper layer is oriented in a (11n")B plane. The indexes n' and n" satisfy the following equations.

$$n' = \frac{n^2 + 2 + (y+1)(n-1)\sqrt{(n+2)^2 - 2y(y+2)(n-1)^2}}{2n + 1 - y(y+2)(n-1)^2}$$

where y is the lattice mismatch between the Si substrate and the intermediate layer.

$$n'' = \frac{n^2 + 2 + (y'+1)(n-1)\sqrt{(n+2)^2 - 2y'(y'+2)(n-1)^2}}{2n + 1 - y'(y'+2)(n-1)^2}$$

where y' is the lattice mismatch between the Si substrate and the upper layer.

There may optionally be provided on the upper layer a top layer made of at least one selected form the group consisting of Hg, Cd, Zn and Mn in combination with at least one selected from the group consisting of Te, Se and S.

Further, there may optionally be provided on the upper layer laminations of layers made of at least one selected form the group consisting of Hg, Cd, Zn and Mn in combination with at least one selected from the group consisting of Te, Se and S, provided that the layers have the same combination of the elements and the layers are different in composition of the selected elements.

Furthermore, there may optionally be provided on the upper layer laminations of layers made of at least one selected form the group consisting of Hg, Cd, Zn and Mn in combination with at least one selected from the group consisting of Te, Se and S, provided that the layers have different combinations of the elements.

Figure 1:
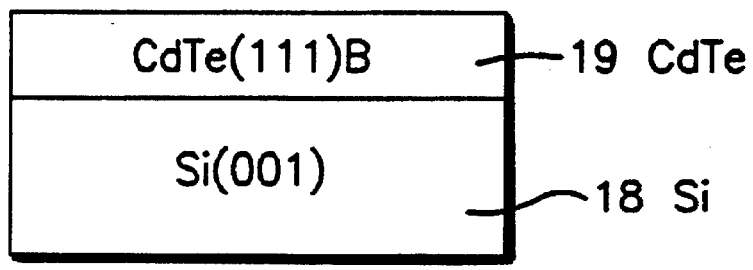
FIG. 1 is a cross sectional elevation view illustrative of the conventional Si base substrate.
Figure 2A:
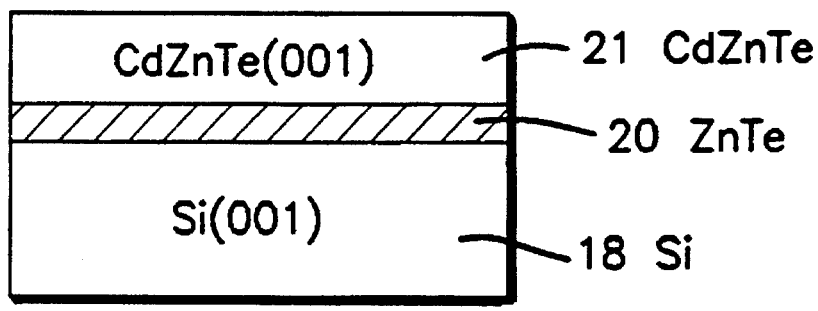
FIG. 2A is a cross sectional elevation view illustrative of another conventional Si base substrate.
Figure 2B:
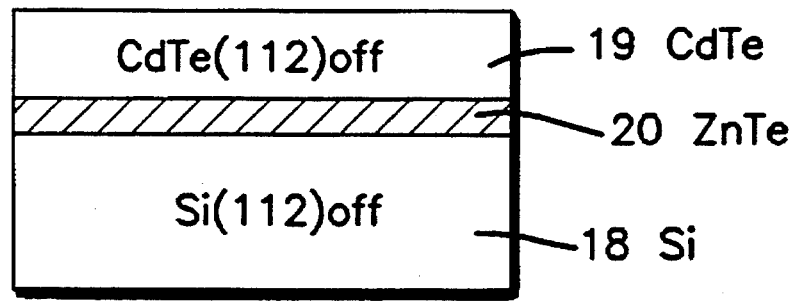
FIG. 2B is a cross sectional elevation view illustrative of still another conventional Si base substrate.
Figure 2C:
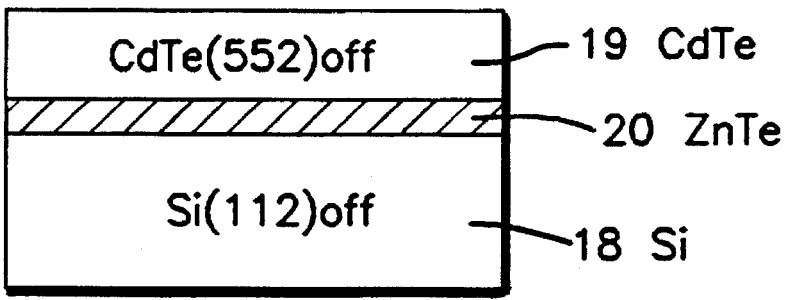
FIG. 2C is a cross sectional elevation view illustrative of yet another conventional Si base substrate.
Figure 3:
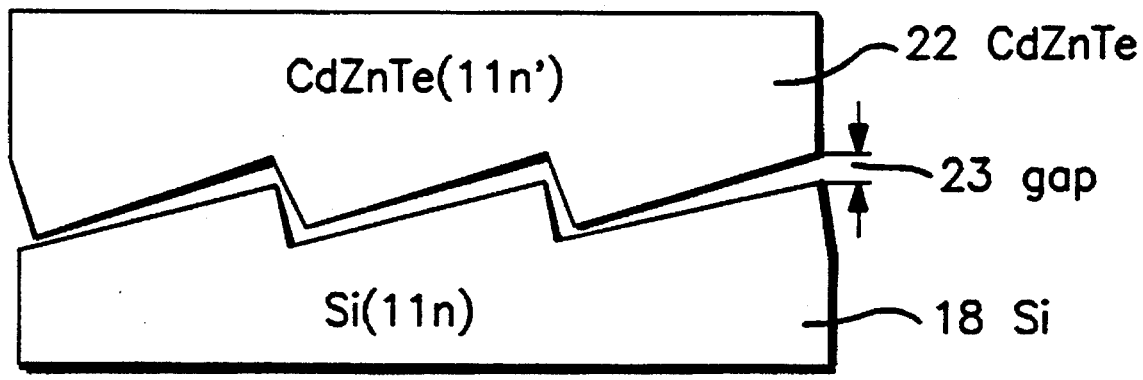
FIG. 3 is a view illustrative of Si(11n)/CdZnTe(11n') interface.

It will be assumed that as illustrated in FIG. 3 a CdZnTe(11 n') layer 22 is grown on an Si(11n) substrate 18. The CdZnTe(11') layer 22 and the Si(11n) substrate 18 have interfaces which have steps and terraces. At the interface between the CdZnTe(11n') layer 22 and the Si(11n) substrate 18, a gap 23 is formed due to a lattice mismatch between them. The lattice mismatch between the CdZnTe(11n') layer 22 and the Si(11n) substrate 18, a gap 23 is expressed as "y". If the plane index n' satisfies the following equation, then the CdZnTe(11n') layer 22 has an interface having steps positioned at the same interval as the Si(11n) substrate 18.

$$n' = \frac{n^2 + 2 + (y+1)(n-1)\sqrt{(n+2)^2 - 2y(y+2)(n-1)^2}}{2n + 1 - y(y+2)(n-1)^2}$$

where the lattice mismatch y is given by dividing a lattice constant of the Si substrate 18 into a remainder given by subtracting the lattice constant of the Si substrate 18 from a lattice constant of the CdZnTe layer 22.

Figure 4:
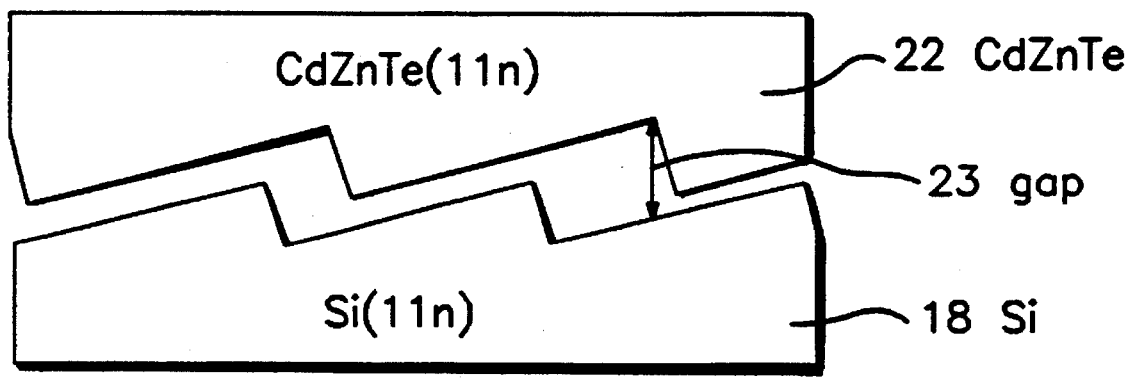
FIG. 4 is a view illustrative of Si(11n)/CdZnTe(11n) interface.

It will be further assumed that as illustrated in FIG. 4 a CdZnTe(11n) layer 22 is grown on the Si(11n) substrate 18, wherein the CdZnTe(11n) layer 22 is oriented in the same plane as the Si(11n) substrate 18. There is a large gap 23 at an interface between the CdZnTe(11n) layer 22 and the Si(11n) substrate 18. The CdZnTe(11n) layer 22 has an interface having steps positioned at an interval different from the Si(11n) substrate 18. The step interval of the CdZnTe(11n) layer 22 differs from the Si(11n) substrate 18 by the lattice mismatch between them. As illustrated in FIG. 4, at the interface between the CdZnTe(11n) layer 22 and the Si(11n) substrate 18, a large stress is generated, resulting in a remarkable deterioration of crystal structure of the CdZnTe(11n) layer 22.

If the CdZnTe(11n') layer 22 has the same step interval as the Si(11n) substrate 18 as illustrated in FIG. 3, then the gap 23 between the CdZnTe(11n') layer 22 and the Si(11n) substrate 18 is not more than 0.6 angstroms.

On the other hand, if the CdZnTe(11n) layer 22 has a step interval different from the Si(11n) substrate 18, then the gap 23 between the CdZnTe(11n') layer 22 and the Si(11n) substrate 18 is not less than 2 angstroms.

If the CdZnTe(11) layer 22 has the same step interval as the Si(11n) substrate 18, this results in a stable bonding energy between them. This can suppress twin-formation in the CdZnTe(11') layer 22.

If the Cd-rich CdZnTe(11n") layer is grown on the Zn-rich CdZnTe(11n') intermediate layer overlaying the Si(11n)substrate, the plane index n" is selected so that the Cd-rich CdZnTe(11n") layer has the same step interval as the Zn-rich CdZnTe(11n') intermediate layer, thereby resulting in an improvement in a crystal quality of the Cd-rich CdZnTe(11n") layer. The plane index n" is given by the following equation.

$$n'' = \frac{n^2 + 2 + (y'+1)(n-1)\sqrt{(n+2)^2 - 2y'(y'+2)(n-1)^2}}{2n + 1 - y'(y'+2)(n-1)^2}$$

where y' is the lattice mismatch between the Si substrate and the Cd-rich CdZnTe(11n") layer.

The Zn-rich CdZnTe(11n') intermediate layer with a thickness in the range of 50–200 angstroms is provided between the Cd-rich CdZnTe(11n") layer and the Si(11n) substrate so that the Cd-rich CdZnTe(11n") layer is free from double domains with different orientations, thereby resulting in an establishment of the crystal growth oriented in the (11n') plane.

If the CdTe layer is grown on the Si(11n) substrate, the CdTe layer is oriented in a (111)off. Zn-blend CdTe(111) plane is slippy so that it is easy to obtain a lattice relaxation due to misfit dislocations. From the above, it may be considered that a large lattice mismatch between CdTe and Si causes that the CdTe crystal layer has the most stable energy state at the (111) plane. Either A-plane or B-plane is available by selecting the growth conditions.

If the Si substrate is covered by a Te layer, the crystal quality is considerably deteriorated even the Te layer has the same orientation.

If the thickness of the intermediate layer is beyond 200 angstroms, this causes the problem with twin-formations. The increase in the thickness of the intermediate layer causes the increase of the probability in the twin-formation. The cause of this phenomenon is that the large lattice mismatch between the. Si substrate and the intermediate layer provides an energy stability when the layer is grown in the twin-formation. If the CdTe layer is grown on the Si(112) substrate in the same orientation, then the lattice mismatch between them is 19.4%. By contrast, if the CdTe layer is grown on the Si(112) substrate with the twin-formation, then an effective lattice mismatch between them is reduced to 4.4%.

If the thickness of the intermediate layer is smaller than the above thickness, the strain of the layer can relax the lattice mismatch. As a result, the layer oriented in the (11n') plane has the most stability of energy.

Accordingly, the Zn-rich CdZnTe(11n') intermediate layer with the thickness in the range of 50–200 angstroms being provided between the Si substrate and the Cd-rich CdZnTe or CdTe layer improves the quality of crystal of the Cd-rich CdZnTe or CdTe layer and also ensures that the Cd-rich CdZnTe or CdTe layer grown is oriented in the (11n') plane.

The present invention also provides a method for forming an Si base semiconductor monocrystal substrate by a molecular beam epitaxy wherein at least one of Cd, Te and Zn is irradiated onto an Si(11n) substrate where n=1.5–2.5. In the method, an intermediate layer being made of Zn-rich CdZnTe and having a thickness in the range of 50–200 angstroms is grown on the Si(11n) substrate at a substrate temperature of not more than 300° C. An upper layer being made of a material selected from the group consisting of CdTe and Cd-rich CdZnTe and having a thickness in the range of 400–1000 angstroms is grown on the intermediate layer at a substrate temperature of not more than 300° C. The substrate is subjected to an in-situ annealing at a temperature in the range of 320°–420° C.

Following to the annealing process, a top layer made of a material selected from the group consisting of CdTe and CdZnTe is grown on the upper layer at a substrate temperature in the range of 200°–350° C.

Alternatively, following to the annealing process, at least one selected from the group consisting of Hg, Cd, Zn and Mn in combination with at least one selected from the group consisting of Te, Se and S are irradiated on the upper layer. As modifications, the irradiations may be carried out with changing the combinations of the selected elements. Alternatively, the irradiations may be carried out with changing doses of the irradiated elements.

It is very important for obtaining the crystal growth in B-plane that only CdTe and Zn are irradiated onto the Si substrate under the condition of Zn-rich to grow the Zn-rich CdZnTe layer.

If the CdZnTe layer is grown under the condition that a ratio of group IV element to group II element is near to 1, the A plane growth or polycrystal growth is obtained. The Zn-rich growth condition allows the B plane crystal growth.

Even if Zn and Cd are irradiated on the Si(11n) substrate, neither Zn nor Cd is adhered on the surface of the Si substrate. If Zn and CdTe are irradiated on the Si(11n) substrate, then Te is first bonded with the Si substrate at the steps. Zn and Cd are then bonded to Te already bonded at the steps of the Si substrate thereby resulting in a growth of the Zn-rich CdZnTe layer on the Si substrate. If the ratio of group IV element to group II element is near to 1, Te layer is formed on the Si substrate. None of Zn-blend crystal structure is obtained, resulting in the A-plane growth or the polycrystal growth.

Even if Cd-rich growth condition is selected, the above problem will appear due to a week bonding between Cd and Si. Even if the B-plane growth is obtained, it is difficult to obtain the CdZnTe layer with the desirable orientation.

In contrast, if the Zn-rich condition is selected, Zn can be bonded to Te bonded at the steps of the Si substrate so that Zn-blend structure is formed to extend on the terraces of the Si substrate. As a result, the B-plane growth is obtained. The lattice mismatch between the Zn-rich CdZnTe layer and the Si substrate is smaller than the lattice mismatch between either the Cd-rich CdZnTe layer or the CdTe layer and the Si substrate. As a result, the desired (11n') plane growth is obtained. Accordingly, the Zn-rich condition at an initial time for the growth is essential to obtain the required B-plane and orientation.

EMBODIMENTS

Figure 5:
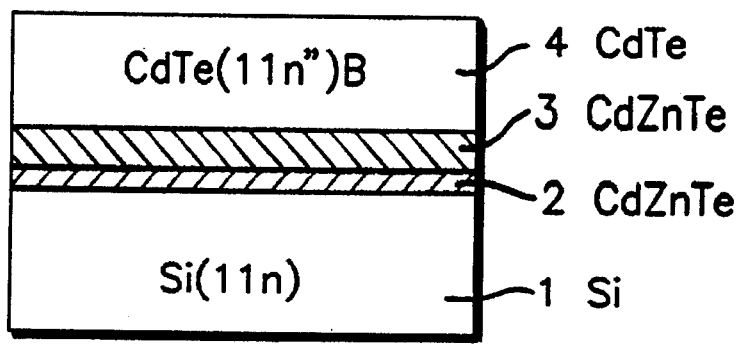
FIG. 5 is a cross sectional elevation view illustrative of a novel Si base substrate in a first embodiment according to the present invention.

A first embodiment according to the present invention will be described. As illustrated in FIG. 5, the Si base substrate structure has an Si (11n) substrate 1 where n=1.5–2.5. A first intermediate layer 2 is formed on the Si substrate 1. The first intermediate layer 2 is made of $Cd_xZn_{1-x}Te$ where x is not more than 0.1. A second intermediate layer 3 is formed on the first intermediate layer 2. The second intermediate layer 3 is made of $Cd_xZn_{1-x}Te$ where x is about 0.7. A top layer 4 is formed on the second intermediate layer 3. The top layer 4 is made of CdTe. The first intermediate layer 2 has a thickness of about 100 angstroms. The second intermediate layer 3 has a thickness of about 500 angstroms. The top layer has a thickness of about 26 micrometers. The substrate 1 has a (1,1,2.43)B plane. The first intermediate layer 2 has a (1,1,2.79)B plane. The top layer 4 has a (1,1,3.03)B plane.

Figure 6:
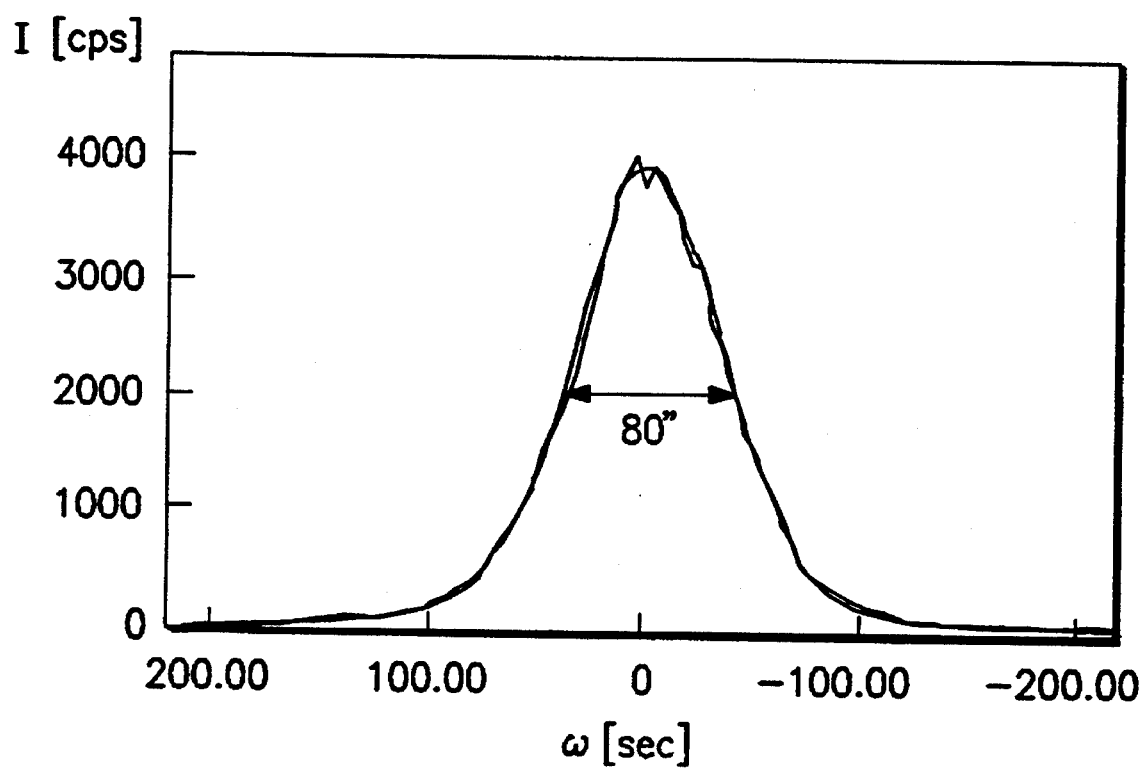
FIG. 6 is a diagram illustrative of X-ray diffraction rocking curve of a novel Si base substrate in a first embodiment according to the present invention.

FIG. 6 illustrates an X-ray diffraction rocking curve of the CdTe layer 4. The measured full width at half maximum (FWHM) of the x-ray diffraction rocking curves (DCRC) is 80 sec, which indicates a high quality of crystal.

Figure 7:
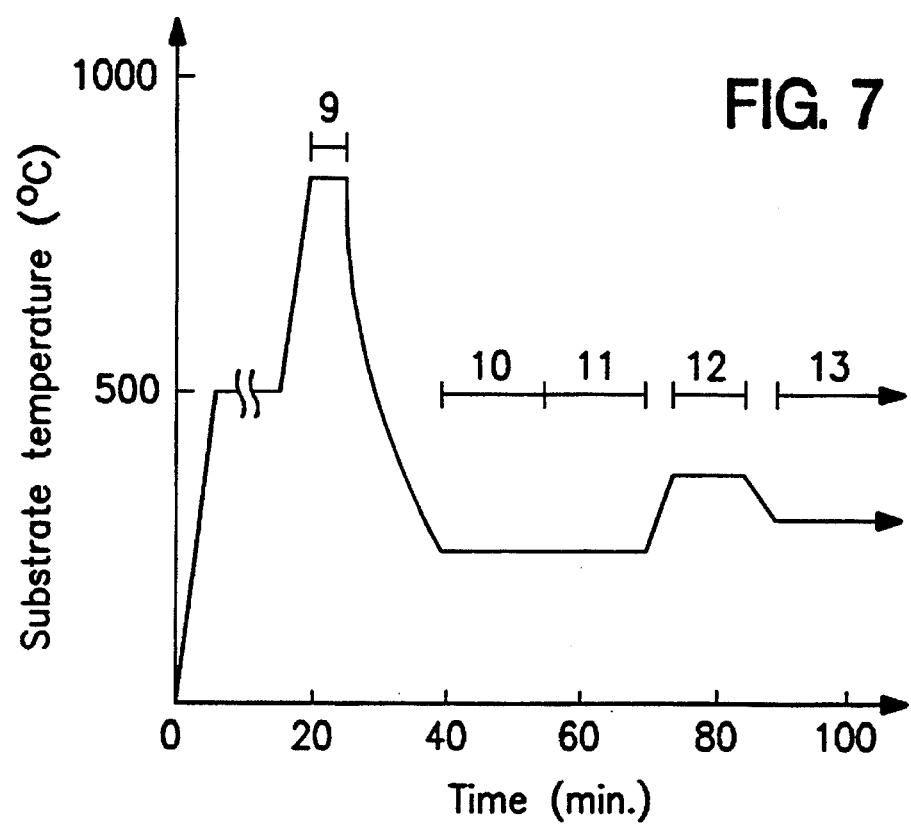
FIG. 7 is a diagram illustrative of a novel method for forming an Si base substrate in a first embodiment according to the present invention.

The above Si base structure may be fabricated as follows. With reference to FIG. 7, the Si substrate 1 is subjected to an RCA cleaning and then introduced into a growth chamber where the Si substrate is kept for a few hours under an ultra-vacuum pressure at a temperature of 500° C. Thereafter, the Si substrate is held at a temperature of 850° C. for five minutes. The Si substrate is then subjected to a cleaning process 9 to remove a surface oxide film from the Si substrate 1. After the temperature is dropped to 250° C., irradiations of Zn and CdTe onto the Si substrate are maintained for 15 minutes to grow the Zn-rich CdZnTe first intermediate layer 2, where the doses Zn and CdTe convened in pressure are approximately $1\times10^{-6}$ Torr and approximately $2\times10^{-8}$ Torr.

Subsequently, the irradiations of Zn and CdTe onto the Si substrate are maintained for 15 minutes to grow the Cd-rich CdZnTe second intermediate layer 3. The doses Zn and CdTe converted in pressure are approximately $2\times10^{-8}$ Torr and approximately $1\times10^{-7}$ Torr. It was confirmed by observing the RHEED pattern that the desirable (11n')B plane is obtained.

As a comparative example, the irradiation of CdTe without Zn irradiation is carried out. As a result, (111) off plane was observed. If the CdZnTe layer 2 is grown until the thickness of the Zn-rich CdZnTe layer 2 is beyond 500 angstroms, twin-formations in the Cd-rich CdZnTe second intermediate layer 3 are observed.

Further, the substrate is subjected to an in-situ annealing process 12 under an ultra-vacuum pressure and at a temperature of 360° C. for 10 minutes. Thereafter, the substrate temperature is dropped to 290° C. An irradiation 13 of CdTe is carried out at a dose of approximately $1\times10^{-6}$ Torr to grow the CdTe top layer 4.

The CdTe layer 4 grown was subjected to the RHEED observation and x-ray diffraction in addition etching text. As a result, it was confirmed that the CdTe layer 4 has a (1,1.3.03)B. The above sequential processes were repeated to confirm the growth of the CdTe layer 4 with the desirable (1,1,3.03)B at a good reproductivity.

The above method is characterized by using CdTe and Zn only. CdTe and Zn are easily available provided that the pureness are not less than 6N. CdTe and Zn may easily be treated in an atmosphere.

In contrast, if ZnTe is used, it is difficult to obtain the required high purity and also hard to treat without any modification of the material or with no impurity introduction.

Figure 8:
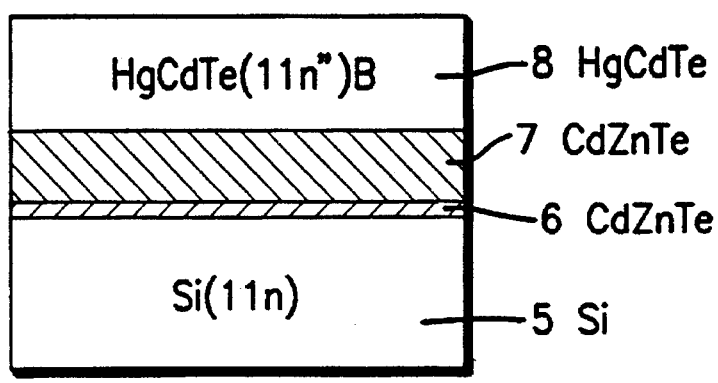

A second embodiment according to the present invention will be described. As illustrated in FIG. 8, the Si base substrate structure has an Si (11n) substrate 5 where n=1.5–2.5. A first intermediate layer 6 is formed on the Si substrate 5. The first intermediate layer 6 is made of $Cd_xZn_{1-x}Te$ where x is not more than 0.1. A second intermediate layer 7 is formed on the first intermediate layer 6. The second intermediate layer 7 is made of $Cd_xZn_{1-x}Te$ where x is not less than about 0.9. A top layer 8 is formed on the second intermediate layer 7. The top layer 8 is made of HgCdTe. The first intermediate layer 6 has a thickness of about 100 angstroms. The second intermediate layer 7 has a thickness of 10 micrometers. The top layer 8 has a thickness of about 14 micrometers. The substrate 5 has a (1,1,1.78)B plane. The first intermediate layer 6 has a (1,1,1.92)B plane. The top layer 8 has a (1,1,2.00)B plane.

FIG. 9 illustrates an X-ray diffraction rocking curve of the HgCdTe layer 8. The measured full width at half maximum (FWHM) of the x-ray diffraction rocking curves (DCRC) is 64 sec, which indicates a high quality of crystal.

This substrate was subjected to a heat treatment in an Hg atmosphere to measure properties thereof. At a temperature of 77K, the substrate shown a carrier concentration of $5.0 \times 10^{14} cm^{-3}$ and an electron mobility of $5.1 \times 10^4 cm^{-2}/Vs$. The measured density of the misfit dislocation was $5.1 \times 10^5 cm^{-2}$. These excellent properties of this substrate are almost equal to properties of HgCdTe crystal layer grown by a low pressure epitaxy on either HgCdTe bulk crystal or CdZnTe substrate. The obtained Si base substrate is superior in view of the low cost, and a large solidity.

On this substrate, the infrared-ray detector is formed to confirm its properties at a temperature of 77K. No deterioration of the properties of the detector due to crystal defects is observed.

The above Si base structure may be fabricated as follows. With reference to FIG. 10, the Si substrate 5 is subjected to an RCA cleaning. After an oxide film on the Si substrate is removed by using a solution of 1% of fluorine acid. The Si substrate 5 is then introduced into a growth chamber where the Si substrate 5 is kept for 10 minutes under an ultra-vacuum pressure at a temperature of 500° C. Thereafter, the Si substrate 5 is subjected to a cleaning process 14 to eliminate hydrogen from the surface of the Si substrate 5. After the temperature is dropped to 250° C., irradiations of Zn and CdTe onto the Si substrate are maintained for 15 minutes to grow the Zn-rich CdZnTe first intermediate layer 6, where the doses Zn and CdTe converted in pressure are approximately $1 \times 10^{-6}$ Torr and approximately $2 \times 10^{-8}$ Torr.

Subsequently, the irradiations of Zn and CdTe onto the Si substrate are maintained for 15 minutes to grow the Cd-rich CdZnTe layer. The doses Zn and CdTe converted in pressure are approximately $2 \times 10^{-9}$ Torr and approximately $1 \times 10^{-8}$ Torr. It was confirmed by observing the RHEED pattern that the desirable (11n')B plane is obtained.

Further, the irradiations 16 of Zn and CdTe onto the Si substrate are maintained for 6 hours to grow the Cd-rich CdZnTe layer, where the doses Zn and CdTe convened in pressure are approximately $2 \times 10^{-8}$ Torr and approximately $1 \times 10^{-6}$ Torr. The substrate temperature is dropped to 180° C. before the irradiations 17 of Hg, CdTe and Zn are carried out to grow an HgCdTe top layer 8.

In this embodiment, the highest temperature of the heat treatment used is only 500° C. The second highest temperature of the heat treatment used is only 360° C. The low temperature heat treatments are suitable for forming a monolithic device.

Whereas modifications of the present invention will be apparent to a person having ordinary skill in the art, to which the invention pertains, it is to be understood that embodiments shows and described by way of illustrations are by no means intended to be considered in a limiting sense. Accordingly, it is to be intended to cover by claims all modifications which fall within the spirit and scope of the invention.

What is claimed is:

1. An Si base semiconductor monocrystal substrate comprising:

an Si(11n) substrate where n=1.5–2.5;

an intermediate layer formed on the Si(11n) substrate, said intermediate layer being made of a material selected from the group consisting of ZnTe and Zn-rich CdZnTe, said intermediate layer having a thickness in the range of 50–200 angstrom, and said intermediate layer being oriented in a (11n')B plane; and an upper layer formed on said intermediate layer, said upper layer being made of a material selected from the group consisting of CdTe and Cd-rich CdZnTe, said upper layer being oriented in a (11n")B plane, wherein the index n' satisfies the following equation, $$n' = \frac{n^2 + 2 + (y+1)(n-1)\sqrt{(n+2)^2 - 2y(y+2)(n-1)^2}}{2n + 1 - y(y+2)(n-1)^2}$$

where y is the lattice mismatch between said Si substrate and said intermediate layer, and wherein the index n" satisfies the following equation, $$n'' = \frac{n^2 + 2 + (y'+1)(n-1)\sqrt{(n+2)^2 - 2y'(y'+2)(n-1)^2}}{2n + 1 - y'(y'+2)(n-1)^2}$$

where y' is the lattice mismatch between said Si substrate and said upper layer.

2. The substrate as claimed in claim 1, further comprising a top layer formed on said upper layer, said top layer being made of at least one selected form the group consisting of Hg, Cd, Zn and Mn in combination with at least one selected from the group consisting of Te, Se and S.

3. The substrate as claimed in claim 1, further comprising laminations of layers formed on said upper layer, said layers being made of at least one selected form the group consisting of Hg, Cd, Zn and Mn in combination with at least one selected from the group consisting of Te, Se and S, provided that said layers have the same combination of the elements and said layers are different in composition of the selected elements.

4. The substrate as claimed in claim 1, further comprising laminations of layers formed on said upper layer, said layers being made of at least one selected form the group consisting of Hg, Cd, Zn and Mn in combination with at least one selected from the group consisting of Te, Se and S, provided that said layers have different combinations of the elements.

5. An Si base semiconductor monocrystal substrate comprising:

an Si(11n) substrate where n=1.5–2.5;

an intermediate layer formed on said Si(11n) substrate, said intermediate layer being made of a material selected from the group consisting of ZnTe and Zn-rich CdZnTe, said intermediate layer having a thickness in the range of 50–200 angstroms, and said intermediate layer being oriented in a (11n')B plane; and an upper layer formed on said intermediate layer, said upper layer being made of a material selected from the group consisting of CdTe and Cd-rich CdZnTe, said upper layer being oriented in a (11n")B plane, wherein the index n' is selected so that an interface of said intermediate layer has steps positioned at the same interval as steps on an interface of said Si substrate, and wherein the index n" is selected so that an interface of said upper layer has steps positioned at the same interval as steps on an interface of said intermediate layer.

6. The substrate as claimed in claim 5, further comprising a top layer formed on said upper layer, said top layer being made of at least one selected form the group consisting of Hg, Cd, Zn and Mn in combination with at least one selected from the group consisting of Te, Se and S.

7. The substrate as claimed in claim 5, further comprising laminations of layers formed on said upper layer, said layers being made of at least one selected form the group consisting of Hg, Cd, Zn and Mn in combination with at least one selected from the group consisting of Te, Se and S, provided that said layers have the same combination of the elements and said layers are different in composition of the selected elements.

8. The substrate as claimed in claim 5, further comprising laminations of layers formed on said upper layer, said layers being made of at least one selected form the group consisting of Hg, Cd, Zn and Mn in combination with at least one selected from the group consisting of Te, Se and S, provided that said layers have different combinations of the elements.

9. An Si base semiconductor monocrystal substrate comprising:

an Si substrate being oriented in a (1,1,2.43)B plane;

a first intermediate layer formed on said Si substrate, said first intermediate layer being made of $Cd_xZn_{1-x}Te$, where the index x is not more than 0.1, said first intermediate layer having a thickness in the range of 50–200 angstroms and said first intermediate layer being orient (1,1,2.79)B plane;

a second intermediate layer formed on said first intermediate layer, said second intermediate layer being made of $Cd_xZn_{1-x}Te$, where the index x is approximately 0.7 and said second intermediate layer being oriented in a (1,1,2.79)B plane; and a top layer formed on said second intermediate layer, said top layer being made of CdTe and said top layer being oriented in a (1,1,3.03)B plane.

10. The substrate as claimed in claim 9, wherein said first intermediate layer has a thickness of approximately 100 angstroms; and said second intermediate layer has a thickness of approximately 500 angstroms.

11. An Si base semiconductor monocrystal substrate comprising:

an Si substrate being oriented in a (1,1,1.78)B plane;

a first intermediate layer formed on said Si substrate, said first intermediate layer being made of $Cd_xZn_{1-x}Te$, where the index x is not more than 0.1, said first intermediate layer having a thickness in the range of 50–200 angstroms and said first intermediate layer being oriented in a (1,1,1.92)B plane;

a second intermediate layer formed on said first intermediate layer, said second intermediate layer being made of $Cd_xZn_{1-x}Te$, where the index x is not less than approximately 0.9 and said second intermediate layer being oriented in a (1,1,1.92)B plane; and a top layer formed on said second intermediate layer, said top layer being made of HgCdTe and said top layer being oriented in a (1,1,2.00)B plane.

12. The substrate as claimed in claim 11, wherein said first intermediate layer has a thickness of approximately 100 angstroms; and said second intermediate layer has a thickness of approximately 10 micrometers.

\* \* \* \* \*